United States Patent
Besser et al.

(10) Patent No.: US 6,172,421 B1
(45) Date of Patent: *Jan. 9, 2001

(54) SEMICONDUCTOR DEVICE HAVING AN INTERMETALLIC LAYER ON METAL INTERCONNECTS

(75) Inventors: Paul Raymond Besser, Sunnyvale; Shekhar Pramanick, Fremont; Takeshi Nogami, Sunnyvale, all of CA (US); Subhash Gupta, Singapore (SN)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/132,282

(22) Filed: Aug. 11, 1998

(51) Int. Cl.$^7$ .................. H01L 23/48; H01L 23/52; H01L 29/40

(52) U.S. Cl. ............... 257/751; 257/647; 257/750; 257/762; 257/764

(58) Field of Search ........... 257/635, 636, 257/640, 647, 648, 750, 751, 762, 763, 764

(56) References Cited

U.S. PATENT DOCUMENTS

| | | | |
|---|---|---|---|
| 5,106,461 | * | 4/1992 | Volfson et al. ............. 205/125 |
| 5,483,105 | * | 1/1996 | Kaja et al. ................. 257/779 |
| 5,539,256 | * | 7/1996 | Mikagi ...................... 257/763 |
| 5,598,027 | * | 1/1997 | Matsuura ................... 257/635 |
| 5,693,563 | | 12/1997 | Teong ........................ 438/627 |
| 5,739,573 | * | 4/1998 | Chiang et al. ............. 257/635 |
| 5,818,110 | * | 10/1998 | Cronin ....................... 257/775 |
| 9,225,546 | | 1/1999 | Brown et al. . |

\* cited by examiner

*Primary Examiner*—Mahshid Saadat
*Assistant Examiner*—Allan R. Wilson
(74) *Attorney, Agent, or Firm*—LaRiviere, Grubman & Payne, LLP

(57) ABSTRACT

The present invention relates to the formation of a protective intermetallic layer 15 on the surface of damascene metal interconnects 12 during semiconductor fabrication. The intermetallic layer 15 prevents problems associated with formation of an oxide layer on the surface of the interconnect. The intermetallic layer is formed by depositing a metal on the surface of the interconnect that will both reduce any present metal oxide layer and form an intermetallic with the interconnect metal.

6 Claims, 3 Drawing Sheets

SEMICONDUCTOR DEVICE HAVING AN INTERMETALLIC LAYER ON METAL INTERCONNECTS

FIELD OF THE INVENTION

The present invention relates to integrated circuits and fabrication techniques for forming a protective intermetallic layer on metal interconnect lines to prevent oxidation and electromigration.

BACKGROUND OF THE INVENTION

In semiconductor wafers utilizing multilayered circuits, damascene metal interconnect lines are used to conduct current through the layers. These interconnect lines were usually made of aluminum heretofore, but they are increasingly being made of copper.

Currently, semiconductor technology is moving away from the use of aluminum as the metal of choice in circuitry and toward the use of copper. This move toward the production of copper semiconductors is receiving intense research because copper conducts electricity with lower resistance than aluminum which results in increased microprocessor speed. Additionally, copper uses less power and costs less than aluminum. Also the physical attributes of copper metal allow for space-saving circuitry design. A discussion of the move toward copper can be found in The Electron, "Smokin . . . Watch Out, Fast Computers are on the way Speed is now Pushing Computing Power," by Andy Maslowski, April/May/June 1998, Vol. 25, No. 2, pp. 1 and 20. The Electron is published at 4781 E. 355th St., Willoughby, Ohio 44094-4698.

In the formation of damascene copper intercornnect lines, a copper oxide layer sometimes forms at the surface of the interconnect line. This copper oxide layer presents several problems to further development of the circuit.

First, the oxidized layer is brittle causing poor adhesion to the next deposited layer in the fabrication process. This can lead to a circuit disconnect or reduced conductivity.

Second, during electrical testing, the fastest diffusion path occurs along the metal oxide layer. This enhances material transport under the applied electric current and increases the electromigration rate of the line.

Electromigration occurs in extended runs of metal lines carrying a high current. A brief discussion of electromigration can be found in a text entitled: *Microchip Fabrication, A Practical Guide to Semiconductor Processing*, 3rd Ed., by Peter Van Zant, McGraw-Hill, p. 392–393. As discussed in the foregoing reference, the current creates an electric field and a thermal gradient. The electric field decreases from the input side to the output side. The current also creates a thermal gradient which makes the metal more mobile. The effect is that the metal begins to diffuse in the direction of the gradients thus thinning the lead. The effect can continue until the line becomes so thin it separates from the input or forms an open circuit and the semiconductor chip fails. As this usually occurs over an extended period of operation, the failure is often seen by the end-user with commercial impact to the producer.

Third, the oxidized layer increases the sheet resistance of the metal in the interconnect. This results in increased resistance to current flow and a less efficient circuit.

Thus it is desirable to have a product and/or process which reduces or eliminates the metal oxide problem described above, especially as it impacts copper and copper oxidation problems, to increase the reliability and performance of the semiconductor circuitry.

BRIEF SUMMARY OF THE INVENTION

In accordance with the present invention, an intermetallic layer is formed on the surface of damascene metal interconnects during semiconductor fabrication. One goal or objective of the present invention is to diminish or eliminate a metal oxide layer that forms on the surface of damascene metal interconnects and form a protective intermetallic layer on the surface of damascene metal interconnects. This and other objectives of the present invention can be achieved by alternative approaches.

The first approach is used where the metal oxide layer is thin enough to be reduced by a deposited metal during formation of the intermetallic layer on the damascene metal interconnect. Such a metal oxide layer may be as thin as 20–50 Å, for example.

The second approach can be generally viewed as a two-step process. It is used where the metal oxide layer is too thick to be reduced by reaction with a deposited metal during the formation of the intermetallic layer. Such a metal oxide layer may be as thick as 50–200 Å, for example. Initially, the metal oxide layer is reduced by exposure to a reducing agent. Then, the intermetallic layer is formed by reaction of the metal interconnect surface with a deposited metal.

BRIEF DESCRIPTION OF THE SEVERAL VIEWS OF THE DRAWINGS

For fuller understanding of the present invention, reference is made to the accompanying drawings in the following detailed description of the best mode of carrying out the invention. In the drawings.

Like numerals denote like parts throughout the several views.

DETAILED DESCRIPTION OF THE INVENTION

As semiconductor fabrication, including integrated circuits, substrates, layers, depositing, sputtering, masking, and etching, are all known in the art, in order to avoid confusion while enabling those skilled in the art to practice the claimed invention, this specification omits many details with respect to those items.

Semiconductor wafer fabrication is a highly complex sequence of production steps. During production, different materials are successively layered and patterned to result in electrical connections between different components in a circuit. A commonly used construct to conduct current through the different layers of materials is a conductive element called a damascene line. It is referred to as "damascene" because of a superficial resemblance to ornamentation traditionally found on swords made in Damascus.

These damascene interconnect lines are presently made of copper which tends to oxidize. This oxidation is believed to be deleterious. Accordingly, the purpose of the present invention is to provide a protective layer on top of the damascene copper interconnect lines to prevent or reduce copper interconnect oxidation.

In semiconductor fabrication, different types of circuits are produced on the wafers. It is contemplated that the present invention is applicable to any type of circuit produced on the wafers in which copper interconnect lines are employed.

Figure 1:
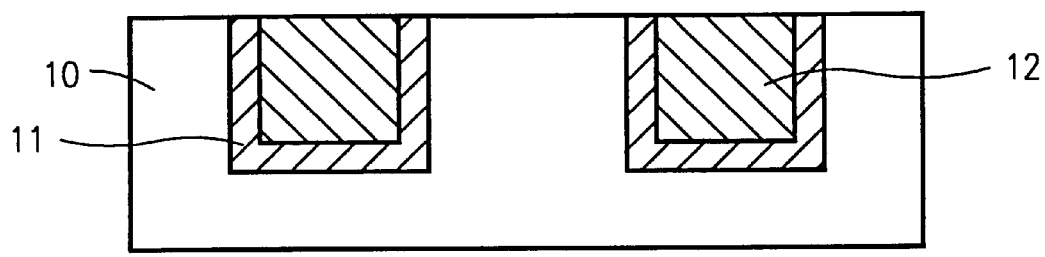
FIGS. 1–5 are enlarged cross-sectional views of an integrated circuit wafer showing the formation of a protective layer where a thin copper oxide layer was present after CMP.

Referring now to the drawings, FIG. 1 is an enlarged cross-sectional view of an integrated circuit in the process of being fabricated. There is shown a substrate 10 which may be made of silicon, for example. On the silicon substrate 10 there is provided a dielectric layer composed of silicon oxide. The silicon oxide may be relatively thick, for example one micrometer. The surface of the silicon oxide is then selectively etched to produce open trenches in the silicon oxide. It will be understood that these "trenches" are in reality minuscule linear longitudinal depressions in the surface of the silicon oxide. A barrier layer 11 is then deposited on the surface of the silicon oxide and the exposed trenches. The barrier layer 11 may be made of a material such as titanium nitride, tantalum, or tantalum nitride, for example, and prevents metal diffusion into the silicon oxide layer.

A conductive metal layer is then deposited on the surface of the barrier layer 11 and filling the trenches to form interconnect lines 12. The conductive layer was formerly made of aluminum or an alloy, but now it is usually made of copper. Excess metal and barrier material are then removed and the surface smoothed through a chemical mechanical polishing (CMP) step leaving the surface of the damascene metal interconnect lines 12 exposed. The surface is now ready for a subsequent layer in the production sequence to be deposited. This process may be repeated many times during semiconductor fabrication as the semiconductor is built up step by step and layer by layer.

Figure 2:
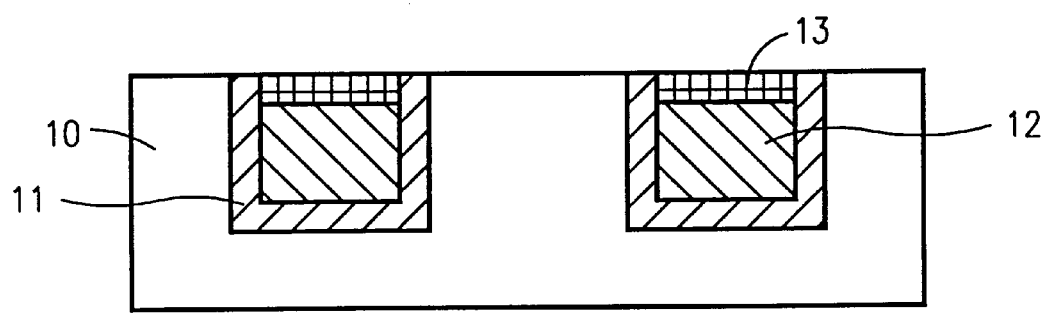

Referring now to FIG. 2, there is shown a copper oxide layer 13 on the surface of the damascene interconnect line 12. The copper oxide layer 13 often forms during the production sequence due to reaction of the copper surface with strong oxidizing slurries used in CMP or exposure of the surface of the copper interconnect line 12 to an oxidizing atmosphere. As previously described, the copper oxide layer 13 has deleterious effects on the circuit. The thickness of the copper oxide layer 13 can vary depending upon the CMP process; stronger oxidizing slurries produce thicker copper oxide layers 13.

The present invention, reduces or eliminates the copper oxide layer 13 by forming a protective intermetallic layer on the surface of the interconnect line 12. The intermetallic layer is formed by deposition of a metal, such as titanium, which both reduces the copper oxide and forms an intermetallic layer with copper. When the copper oxide layer 13 is thin, for example, 20–50 Å, the deposited titanium can both reduce the copper oxide layer 13 and form the intermetallic layer. However, when the copper oxide layer 13 is thick, for example, 50–200 Å, often the deposited titanium cannot completely reduce the copper oxide layer 13 during formation of the intermetallic layer. In such a case, it is desirable to first reduce the copper oxide layer 13 before forming the intermetallic layer. It is to be understood that, depending upon the production sequence and efficiency requirements, it may be preferable to first reduce the copper oxide layer 13 prior to forming the intermetallic layer without regard to whether the copper oxide layer 13 is thin or thick.

Figure 3:
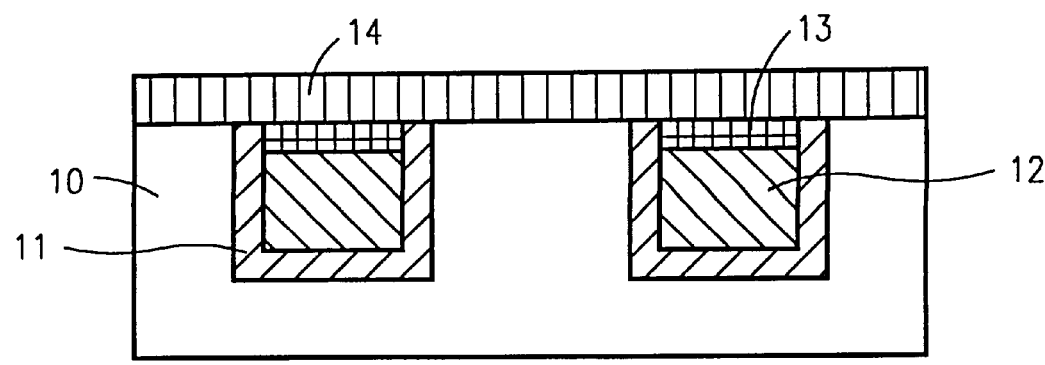

Referring now to FIG. 3, there is shown the substrate 10 with a copper oxide layer 13 that is thin, for example, 20–50 Å, that has resulted from exposure of the copper surface of the interconnect line 12 to an oxidizing slurry or atmosphere. Titanium 14, or another metal that both reduces copper and forms an intermetallic layer, is deposited on the substrate 10. The preferred method of deposition is sputtering, but other methods of physical vapor deposition or chemical deposition may be used. The substrate 10 is then annealed to both reduce the copper oxide layer 13 and to form an intermetallic layer of $CuTi_2$. The preferred method of annealing is in a rapid thermal annealer (RTA) for 10 to 60 seconds at 200° C.–450° C. in a nitrogen or argon atmosphere. The RTA provides fast high temperature heating of a wafer to achieve a desired result. An AST 2800 RTA was used in practicing the present invention, although other annealers that can produce the above temperature and time parameters may be used, if desired. It may also be necessary to employ production capacity annealers that meet the above temperature and time parameters for high volume production.

Figure 4:
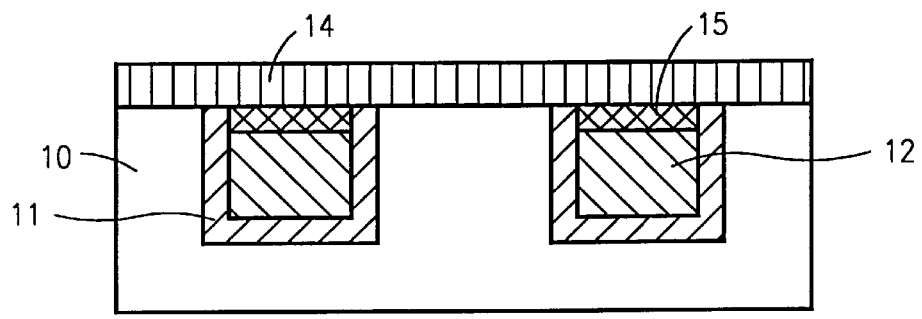

Referring now to FIG. 4, there is shown the formed intermetallic layer 15 of $CuTi_2$ formed during annealing. The process ordinarily results in some unreacted titanium and other titanium by-products. It is next necessary to remove the unreacted titanium and any other titanium by-products, leaving only the intermetallic layer 15 above the damascene interconnect line 12 by an etching process. The surface of the substrate 10 is selectively etched with an etching solution to remove the excess deposited metal. The etching solution must be selective to the $CuTi_x$ intermetallic layer 15, yet still remove the unreacted titanium and by-products.

Figure 5:
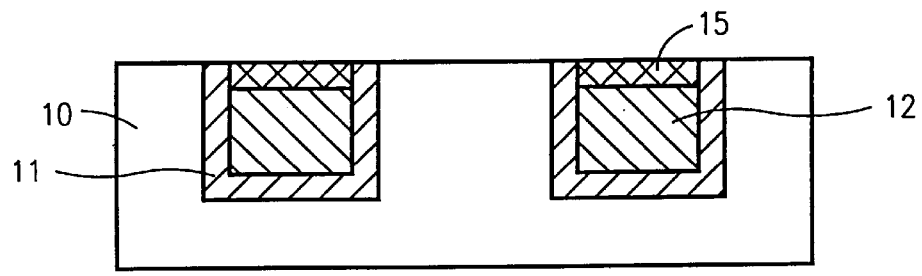

Referring now to FIG. 5, there is shown the substrate 10 after etching with a solution selective to $CuTi_2$, but not to titanium or titanium by-products, leaving the $CuTi_2$ intermetallic layer 15 on the surface of the damascene interconnect line 12. The formation of the $CuTi_2$ intermetallic layer 15 is now complete and the surface is ready for the next step in the fabrication process.

As previously described, often the copper oxide layer 13 is too thick to be completely reduced during formation of the intermetallic layer as described above in connection with FIGS. 1–5. In such a case, it is necessary to first reduce the copper oxide layer by exposure to a reducing agent prior to formation of the intermetallic layer.

Figure 6:
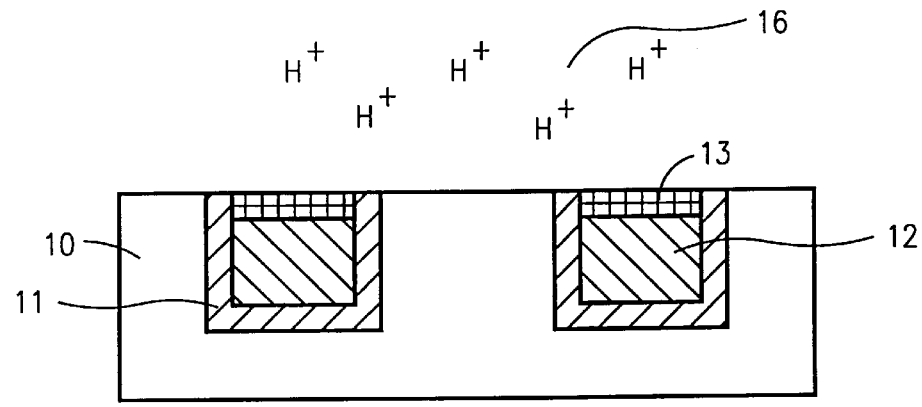
FIGS. 6 and 7 are enlarged cross-sectional views of an integrated circuit wafer showing an alternative process for forming a protective layer where a thick copper oxide layer was present after CMP.

Referring now to FIG. 6, there is shown the substrate 10 with a copper oxide layer 13 that is thick, for example 50–200 Å. Prior to deposition of the titanium 14, or other intermetallic forming metal, the substrate 10 is exposed to hydrogen plasma 16 to reduce the copper oxide layer 13. The reducing agent can also be ammonia plasma or silane, if desired. The reduction leaves an unoxidized copper surface that is ready for deposition of the titanium 14 and the formation of the intermetallic layer.

Figure 7:
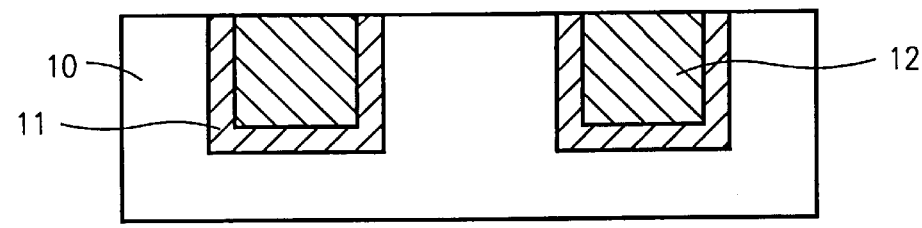

Referring now to FIG. 7, there is shown the surface of the resultant unoxidized copper interconnect line 12. Following exposure to the hydrogen plasma 16, or other reducing agent, the intermetallic layer 15 is formed as previously described by deposition of titanium, annealing, and etching.

Figure 8:
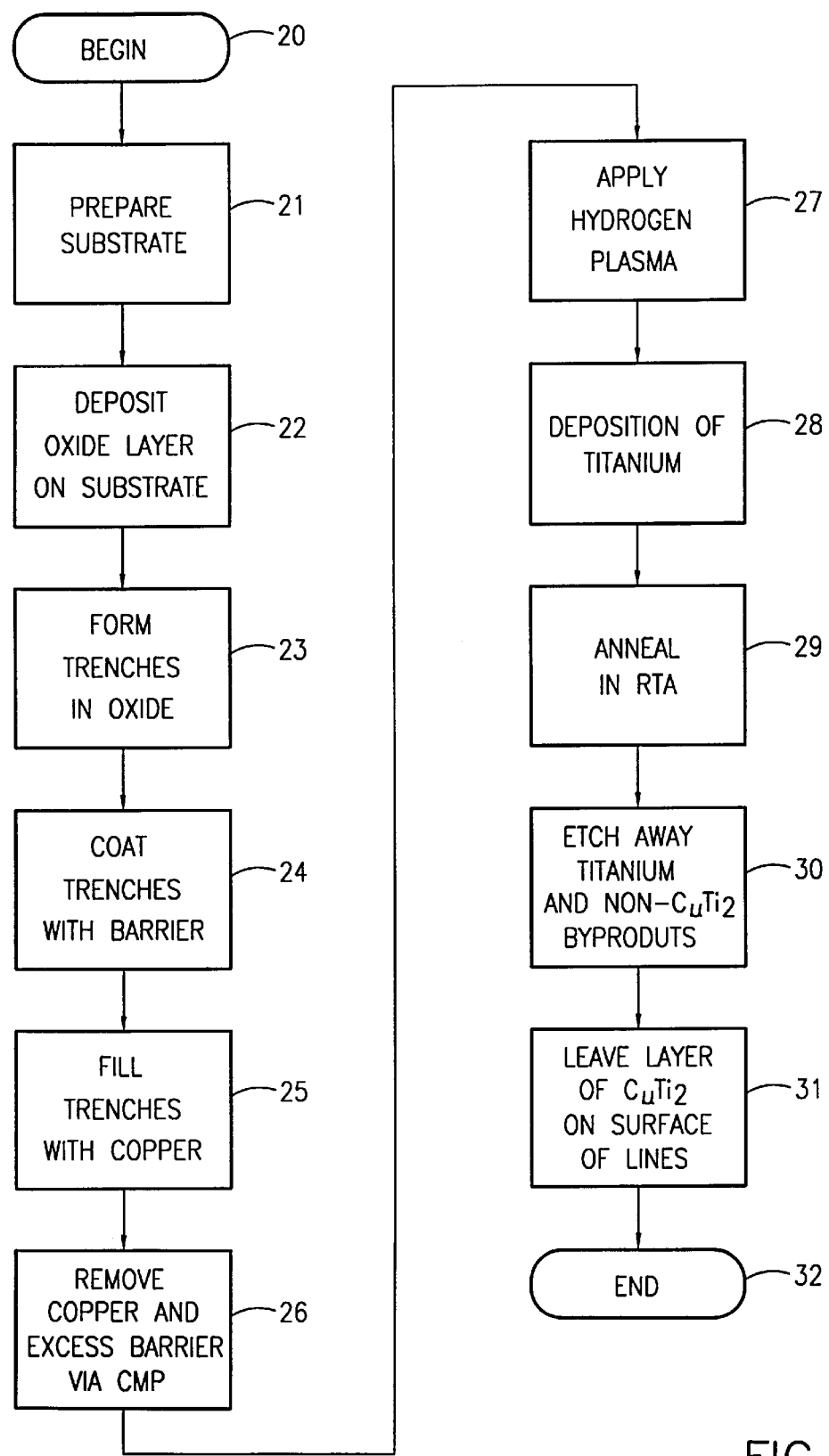
FIG. 8 is a process flow chart showing steps in the process of fabricating an integrated circuit.

Referring now to FIG. 8, there is shown a flow chart illustrating the process steps of the present invention. The process begins at a starting block 20 labelled "Begin." The first step 21 is to prepare the silicon substrate 10. An oxide layer is deposited on the substrate in step 22. The oxide layer is etched to produce damascene trenches in step 23. A layer of barrier material is deposited on the substrate coating the trenches in step 24. The trenches are then filled by deposition of a layer of copper on the substrate in step 25. The excess barrier material and copper are then removed by CMP in step 26. The substrate is then exposed to a reducing agent, such as hydrogen plasma, to reduce any copper oxide that has formed during CMP in step 27. A layer of titanium is then deposited on the substrate in step 28. The substrate is then annealed in an RTA to form the intermetallic layer by reaction of the titanium with the copper surface in step 29. The unreacted titanium and by-products are then etched away using an etching solution selective to $CuTi_2$ in step 30. The result of the etching is the protective intermetallic layer on the surface of the interconnect line in step 31. The process is then complete and the substrate is ready for the next step in the production sequence at block 32 labeled "End."

Thus, there has been disclosed a process for preventing oxidation of damascene copper interconnect lines by coating them with a protective copper intermetallic layer. Clearly, this process forms a product comprising a substrate having an oxide layer in which is a trench. A barrier layer is disposed in the trench and a copper interconnect line fills the trench. Over the copper interconnect line, is disposed a protective intermetallic layer.

Although the present invention has been described in considerable detail with reference to certain preferred versions thereof, other versions are possible. For example, the metal used in the damascene interconnect line is not limited to copper, but can also be aluminum, or another metal or alloy suitable for use in semiconductor interconnects that will form an intermetallic with a deposited metal. The deposited metal used to form the intermetallic layer with the metal interconnect is not limited to titanium, but can be another metal or alloy suitable for forming an intermetallic with the metal interconnect. Titanium is the preferred deposited metal because it has the dual properties of both reducing the oxide layer and forming the intermetallic layer. The method of deposition of the titanium is not limited to sputtering, but can be performed by other methods of physical vapor deposition or chemical deposition. The reducing agent is not limited to hydrogen plasma, but could also be an ammonia plasma, or silane. The ambient atmosphere can be varied depending on the specific reactants and requirements of the particular step of the fabrication.

Other modifications, changes, and substitutions are intended in the foregoing disclosure and in some instances, some features of the invention can be employed without a corresponding use of other features. Accordingly, it is appropriate that the appended claims be construed broadly and in a manner consistent with the scope of the invention and not limited to the description of the preferred versions contained herein.

What is claimed is:

1. A semiconductor device, said device comprising:
    (a) a semiconductor substrate;
    (b) at least one trench formed in said semiconductor substrate, each of said at least one trench having a floor surface and a plurality of wall surfaces;
    (c) a barrier material layer coated on said floor surface and said plurality of wall surfaces, said barrier material layer being a barrier material selected from the group consisting of tantalum, tantalum nitride, and titanium nitride;
    (d) at least one copper interconnect disposed over said barrier material layer, said at least one copper interconnect having an upper surface and a lower surface, said lower surface being disposed adjacent lo said barrier material layer; and
    (e) a copper titanide protective intermetallic layer formed on said upper surface of said copper interconnect by annealing in an inert atmosphere, and
    whereby said barrier material layer and said copper titanide protective intermetallic layer prevent oxidation of said copper interconnect.

2. A semiconductor device, as recited in claim 1,
    wherein said copper titanide protective intermetallic layer comprises a stoichiometric single-specie copper titanide ($CuTi_2$), and
    wherein said stoichiometric single-specie copper titanide is a face-centered cubic ordered tetragonal crystalline structure for providing maximum packing density and inherently maximizing protection against oxidation and electromigration.

3. A semiconductor device, said device comprising:
    (a) a semiconductor substrate;
    (b) at least one trench formed in said semiconductor substrate, each of said at least one trench having a floor surface and a plurality of wall surfaces;
    (c) a barrier material layer coated on said floor surface and said plurality of wall surfaces, said barrier material layer being a barrier material selected from the group consisting of tantalum, tantalum nitride, and titanium nitride;
    (d) at least one metal interconnect formed by a conductive material, said conductive material selected from the group consisting of copper, aluminum, and gold, disposed over said barrier material layer, said at least one metal interconnect having an upper surface and a lower surface, said lower surface being disposed adjacent to said barrier material layer; and
    (e) a metal titanide protective intermetallic layer formed on said upper surface of said metal interconnect by annealing in an inert atmosphere,
    whereby said barrier material layer and said metal titanide protective intermetallic layer prevent oxidation of said metal interconnect.

4. A semiconductor device as recited in claim 3,
    wherein said copper titanide protective intermetallic layer comprises a stoichiometric single-specie copper titanide ($CuTi_2$), and
    wherein said stoichiometric single-specie copper titanide is a face-centered cubic ordered tetragonal crystalline structure for providing maximum packing density and inherently maximizing protection against oxidation and electromigration.

5. A semiconductor device, said device comprising:
    (a) a semiconductor substrate;
    (b) at least one trench formed in said semiconductor substrate, each of said at least one trench having a floor surface and a plurality of wall surfaces;
    (c) a barrier material layer coated on said floor surface and said plurality of wall surfaces, said barrier material layer being a barrier material selected from the group consisting of tantalum, tantalum nitride, and titanium nitride;
    (d) at least one copper interconnect disposed over said barrier material layer, said at least one copper interconnect having an upper surface and a lower surface, said lower surface being disposed adjacent to said barrier material layer; and (e) a protective intermetallic material layer, said intermetallic material selected from the group consisting of titanium, titanium-tungsten, and titanium nitride formed on said upper surface of said copper interconnect by annealing in an inert atmosphere, and whereby said barrier material layer and said protective intermetallic material layer prevent oxidation of said copper interconnect.

6. A semiconductor device as recited in claim 5, wherein said copper titanide protective intermetallic layer comprises a stoichiometric single-specie copper titanide ($CuTi_2$), and wherein said stoichiometric single-specie copper titanide is a face-centered cubic ordered tetragonal crystalline structure for providing maximum packing density and inherently maximizing protection against oxidation and electromigration.

* * * * *